(12) United States Patent
Schpok et al.

(10) Patent No.: US 9,189,573 B2
(45) Date of Patent: Nov. 17, 2015

(54) METHODS AND SYSTEMS TO SYNTHESIZE TERRAIN ELEVATIONS UNDER OVERPASSES

(71) Applicant: Google Inc., Mountain View, CA (US)

(72) Inventors: Joshua Sam Schpok, Milpitas, CA (US); Jamie Adams, San Ramon, CA (US)

(73) Assignee: Google Inc., Mountain View, CA (US)

( * ) Notice: Subject to any disclaimer, the term of this patent is extended or adjusted under 35 U.S.C. 154(b) by 539 days.

(21) Appl. No.: 13/657,307

(22) Filed: Oct. 22, 2012

(65) Prior Publication Data
US 2015/0169793 A1 Jun. 18, 2015

Related U.S. Application Data

(60) Provisional application No. 61/656,353, filed on Jun. 6, 2012.

(51) Int. Cl.
*G06F 7/60* (2006.01)
*G06F 17/10* (2006.01)
*G06F 17/50* (2006.01)
*G06T 17/05* (2011.01)

(52) U.S. Cl.
CPC .......... *G06F 17/5009* (2013.01); *G06T 17/05* (2013.01)

(58) Field of Classification Search
CPC ........ G06F 7/60; G06F 17/5009; G06F 17/10
USPC ............. 703/2; 702/19, 22; 706/16, 21, 25; 704/250; 382/132; 345/421
See application file for complete search history.

(56) References Cited

U.S. PATENT DOCUMENTS

| | | | |
|---|---|---|---|
| 2003/0142523 A1* | 7/2003 | Biacs | 365/1 |
| 2008/0131029 A1* | 6/2008 | Coleby et al. | 382/300 |
| 2014/0362082 A1* | 12/2014 | Schpok | G06T 17/05 345/427 |

OTHER PUBLICATIONS

Schpok "Geometric Overpass Extraction from Vector Road Data and DSM". Nov. 2011. ACM. 6 Pages.*
NDEP. "Guidlelines for Digital Elevation Data Version 1.0". National Digtial Elevation Program (NDEP) May 10, 2004. 98 Pages.*

* cited by examiner

*Primary Examiner* — Eunhee Kim
(74) *Attorney, Agent, or Firm* — Dority & Manning, P.A.

(57) ABSTRACT

Systems, methods and computer storage apparatuses for synthesizing terrain elevations under overpasses are described herein. An embodiment includes identifying one or more spans across an overpass in an overpasses model, where the overpasses model includes information for one or more overpasses and respective locations and widths of the spans. The embodiment associates one or more terrain elevation values with the one or more identified spans, where the terrain elevation values can be included in an elevation model corresponding to the overpasses model. The embodiment further includes interpolating terrain elevation values for one or more points across the identified spans and updating the elevation model with the interpolated terrain elevation values.

20 Claims, 7 Drawing Sheets

METHODS AND SYSTEMS TO SYNTHESIZE TERRAIN ELEVATIONS UNDER OVERPASSES

CROSS REFERENCE TO RELATED APPLICATIONS

This application claims the benefit of U.S. Provisional Application No. 61/656,353, filed on Jun. 6, 2012, which is incorporated herein by reference in its entirety.

BACKGROUND

1. Field

Embodiments generally relate to geographical terrain modeling.

2. Background Discussion

Digital Terrain Models (DTMs) are used for many applications in Geographical Information Systems (GIS) ranging from three dimensional (3D) terrain viewing applications to orthorectification (the geometric scaling of aerial photographs so they can be used as maps) and flood plain analysis. A DTM is a data file containing the elevation of the bare Earth (the terrain) at various points on the Earth's surface. As an example, elevations in a DTM can be specified in a square grid of cells with the grid represented in a coordinate system such as latitude and longitude. The elevation of terrain in a cell can be represented by an elevation value associated with the cell.

DTMs are commonly built with data gathered by remote sensing techniques such as photogrammetry or LiDAR (Light Detection And Ranging). In addition to terrain elevations, these techniques also produce the elevations of features such as vegetation, buildings, bridges and road overpasses that are on or above the terrain. Since terrain elevations in DTM cells under a feature are occluded by the feature, various processing steps are used to locate the features and estimate the terrain elevations in the occluded cells. The estimation techniques might use valid terrain elevations in the neighborhood of the feature together with surface fitting (e.g., a Laplacian surface) to estimate the occluded terrain elevation values. In some cases, which could occur, for example, when the occluded terrain has sharp features and elevation changes rapidly, these estimates are not accurate enough and manual editing of estimated terrain elevation values is needed to achieve desired accuracy. This manual editing increases the cost of producing DTMs. Furthermore, because the estimates are not sufficiently accurate, features rendered using these estimates appear to merge with surrounding terrain gradations. This degrades user viewing experience. In other applications (e.g., erosion modeling, flood plain analysis) inaccuracies in estimated elevations can cause erroneous results.

BRIEF SUMMARY

Embodiments relate to synthesizing terrain elevation values in elevation model cells occluded by an overpass. An embodiment includes identifying one or more spans across an overpass in an overpasses model, where the overpasses model includes information for one or more overpasses and respective locations and widths of the spans. The embodiment associates one or more terrain elevation values with the one or more identified spans, where the terrain elevation values can be included in an elevation model corresponding to the overpasses model. The embodiment further includes interpolating terrain elevation values for one or more points across the identified spans and updating the elevation model with the interpolated terrain elevation values.

In this way, the interpolated terrain elevation values can be used to appropriately elevate roads in places where there are rapid elevation changes perpendicular (or adjacent) to the roads.

BRIEF DESCRIPTION OF THE DRAWINGS

Embodiments are described with reference to the accompanying drawings. In the drawings, like reference numbers may indicate identical or functionally similar elements. The drawing in which an element first appears is generally indicated by the left-most digit in the corresponding reference number.

DETAILED DESCRIPTION

Embodiments relate to the synthesis of terrain elevation values under overpasses. In one example, the overpass can be carrying a road and passing over another road at a lower elevation, in which case digital terrain model (DTM) cells in the lower road are occluded by the upper (or overpassing) road. As noted above, an embodiment includes identifying one or more spans across an overpass in an overpasses model, where the overpasses model includes information for one or more overpasses and respective locations and widths of the spans. The embodiment associates one or more terrain elevation values with the one or more identified spans, where the terrain elevation values can be included in an elevation model corresponding to the overpasses model.

The embodiment further includes interpolating terrain elevation values for one or more points across the identified spans and updating the elevation model with the interpolated terrain elevation values. In an embodiment, the points correspond to invalid (or even unavailable) terrain elevation values in the elevation model.

In an embodiment, a span is a line rendered as cells and perpendicular to a road on the surface of the overpass. Those spans with endpoints in a cell having a valid terrain elevation value can be identified and interpolation is used to calculate elevation values in cells along each identified span. In an embodiment, the calculated (or interpolated) values are used to update the terrain elevation model for the associated cells under the overpass.

Since spans may tend to be parallel to a road under an overpass, interpolation along a span will produce accurate elevation values, particularly when roll (road banking) and elevation variation along the direction of the road are limited. The interpolated elevation values determined by the embodiments reduce (or even eliminate) the need for manual editing of elevation values, especially for the conditions of limited roll and elevation variation, which may be considerations for a road under an overpass.

In this way roads, for example, are appropriately elevated even in places where there are elevation changes (e.g., rapid elevation changes) perpendicular (or adjacent) to the road. These elevation changes may occur where overpass berms (i.e., artificial ridges or embankments) meet underlying roads.

With conventional methods, such as fitting a smooth curve to the terrain, results can be inaccurate when there are rapid elevation changes. The inaccuracies degrade a user's viewing experience. In other applications (e.g., erosion modeling, flood plain analysis) the elevation inaccuracies can cause erroneous results. Conventional methods manually edit the rendered image or the elevation values to provide the needed rendering quality and accuracy. The manual editing increases the cost of producing DTMs.

While the present embodiments are described herein with reference to illustrative applications, it should be understood that the embodiments are not limited thereto. Those skilled in the art with access to the teachings provided herein will recognize additional modifications, applications, and embodiments within the scope thereof and additional fields in which the embodiments would be of significant utility.

Figure 1:
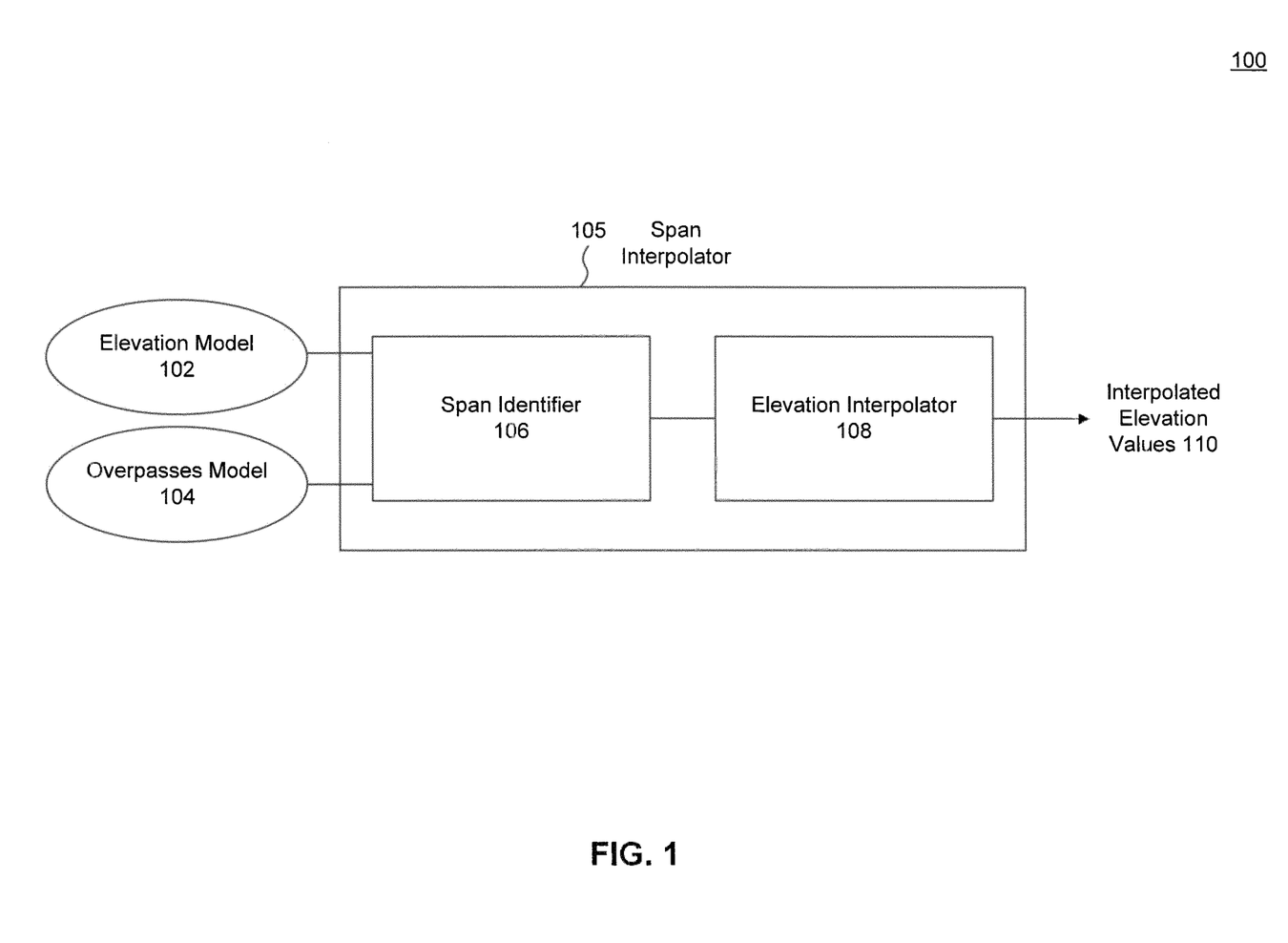
FIG. 1 illustrates a system for synthesizing elevation values using interpolation, according to an embodiment.

FIG. 1 is a diagram of system 100 for synthesis of terrain elevation values under overpasses, according to an embodiment. While the following is described in terms of overpasses and roads, the embodiments are not limited to such data and the techniques described herein and can be applied to any form of data, including but not limited to overpasses passing over a train track, path, canal, river, or other pathway. The embodiments are applicable to any system having generally the structure of FIG. 1, or that would benefit from the operation, methods and functions as described herein.

System 100 includes elevation model 102 and overpasses model 104 as input to span interpolator 105. Elevation model 102 and overpasses model 104 may be received and/or retrieved from storage by span interpolator 105. Span interpolator 105 generates interpolated elevation values 110.

In an embodiment, elevation model 102 can be any terrain elevation model representing elevation values of the "bare" Earth that does not include non-terrain features such as vegetation, buildings and bridges. Elevation model 102 can be any data structure storing one or more elevation values. As an example, elevation model 102 can include one or more observed (or measured) elevation values of terrain that are considered to be accurate elevation values for the bare Earth.

In an embodiment, overpasses model 104 is any model representing the geographic and physical characteristics of an overpass carrying a road and passing over a road, including its location and width and description of one or more spans on the surface of the overpass. Spans are lines rendered as cells and perpendicular to a path on the surface of the overpass.

Figure 2:
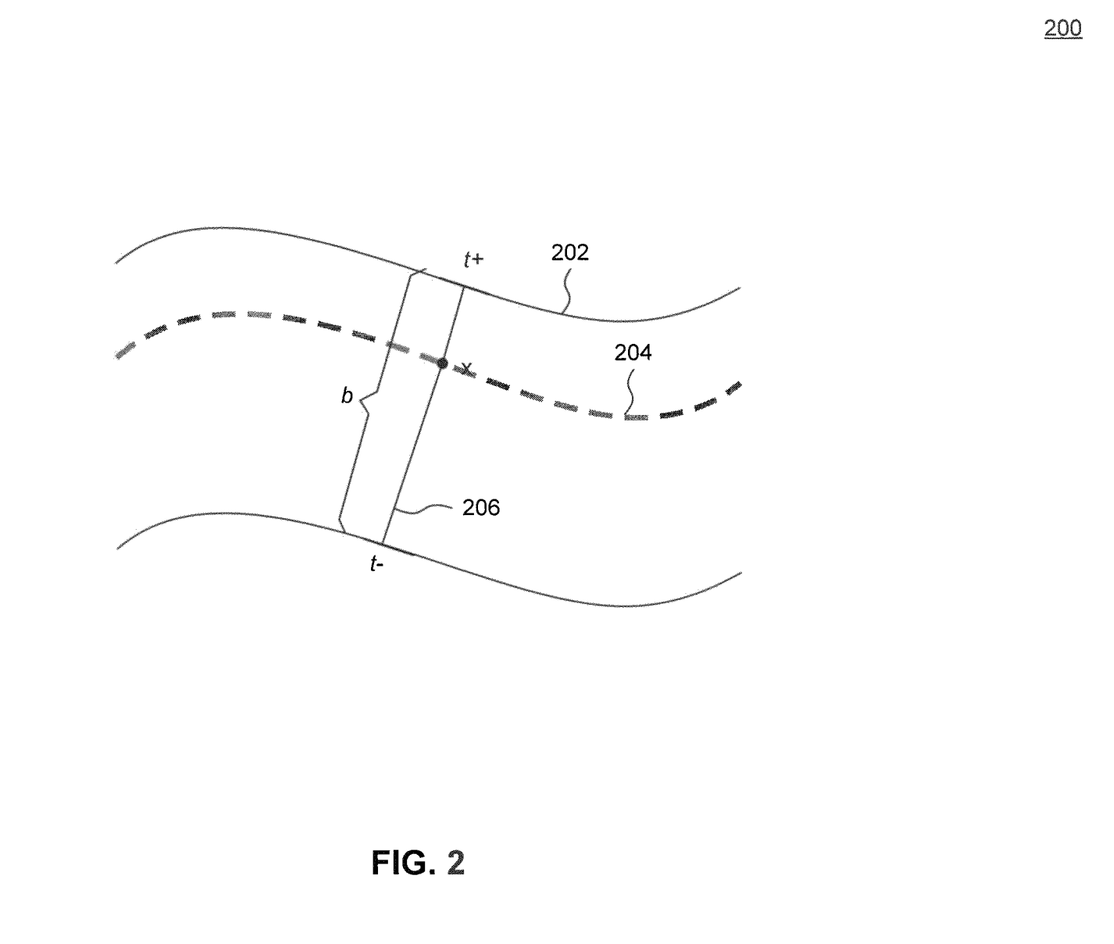
FIG. 2 illustrates a synthesis of a span for an overpass carrying a road.

FIG. 2 shows a span 206 on the surface of overpass 202 which is carrying a road surface which has a road vector 204. At any point 'x' on road vector 204, span 206 can be constructed perpendicular to road vector 204. Span 206 is then extended in both directions from point x until there is a rapid decrease in elevation at each edge of overpass 202. The points corresponding to this rapid decrease indicate the edges of the overpass and define the endpoints 't−' and 't+' of span 206. The distance between t− and t+ is the overpass width 'b'. FIG. 2 is purely illustrative and is not intended to limit the embodiments.

In an embodiment, span interpolator 105 includes the span identifier 106. Span identifier 106 aligns overpasses model 104 and elevation model 102 and then identifies spans from overpasses model 104 that can be used to synthesize terrain elevation values. The alignment, for example, determines correspondences between points in overpasses model 104, such as points in a span, and elevation values in elevation model 102.

In an embodiment span identifier 106 then examines each endpoint of each span (e.g., t+ and t−) to determine if it falls in a cell that has an observed or measured terrain elevation value (i.e., a valid value). In an embodiment, span identifier 106 identifies each span having each endpoint located in a cell with a valid terrain elevation value and associates the elevation values in those cells with the corresponding endpoints. For example, endpoints t+ and t− may be associated with elevation values in cells corresponding to those endpoints.

Figure 3:
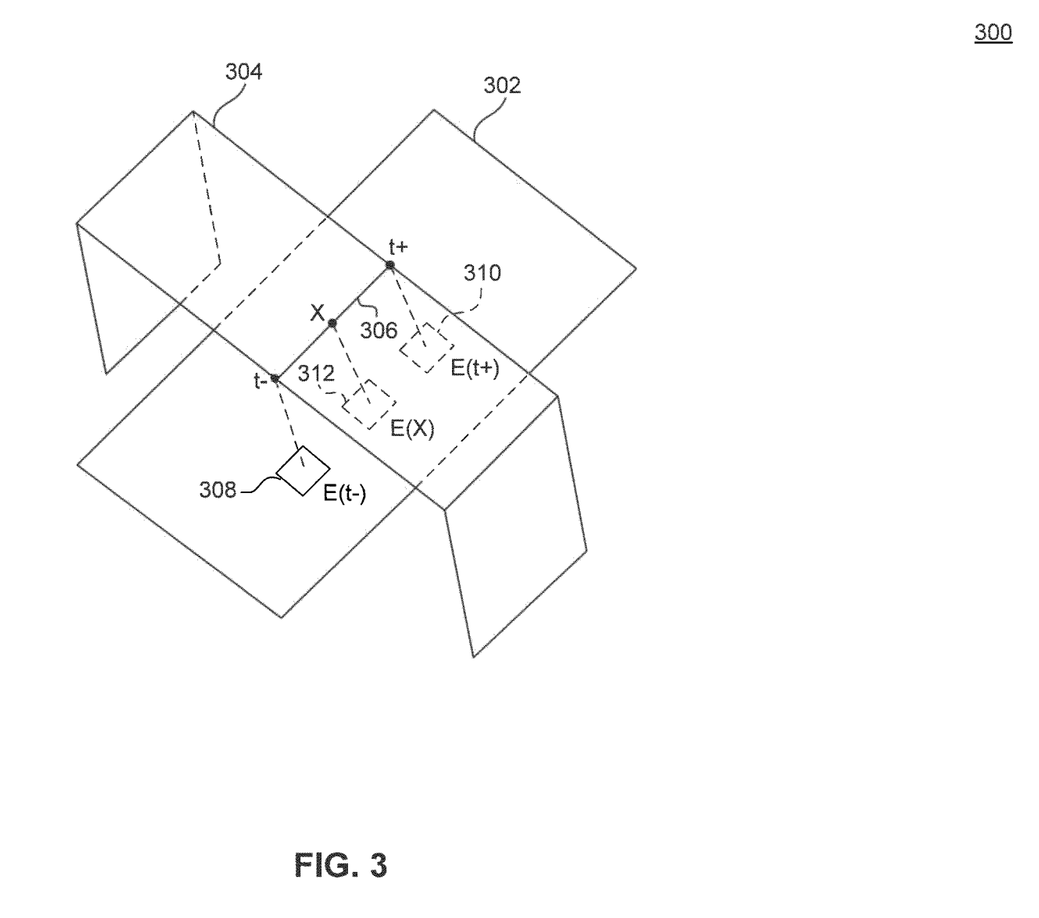
FIG. 3 illustrates an interpolation method, according to an embodiment.

In an embodiment, elevation interpolator 108 is configured to calculate interpolated elevation values 110 along each identified span. In an embodiment, linear one-dimensional interpolation is used as shown in FIG. 3. A road 302 passes under an overpass 304 which may also carry a road. A span 306 is shown on the surface of the overpass with endpoints denoted t− and t+. t− falls in cell 308 which has an observed elevation value of E(t−). t+ falls in cell 310 which has an observed elevation value of E(t+). 'X' is a point on the span between points t− and t+ and falls in cell 312 with an unknown terrain elevation value denoted E(X).

Using linear one-dimensional interpolation, E(X) can be computed as a function of the known values E(t−) and E(t+) using the following equation:

$$E(X)=E(t-)+[E(t+)-E(t-)]*|X-(t-)|/|(t+)-(t-)| \quad (1)$$

|X−(t−)| is the length of the line segment between points X and t−. |(t+)−(t−)| is the length of the line segment between points t+ and t−. Equation 1 can be used by elevation interpolator 108 to compute interpolated elevation values for all cells along the span 306 between endpoints t− and t+. The interpolated elevation values are used by elevation interpolator 108 to update the corresponding cells of the elevation model 102. It is to be appreciated that the embodiments are not limited to the exemplary equation illustrated in equation (1) and can use any other form of interpolation or function(s).

Figure 4:
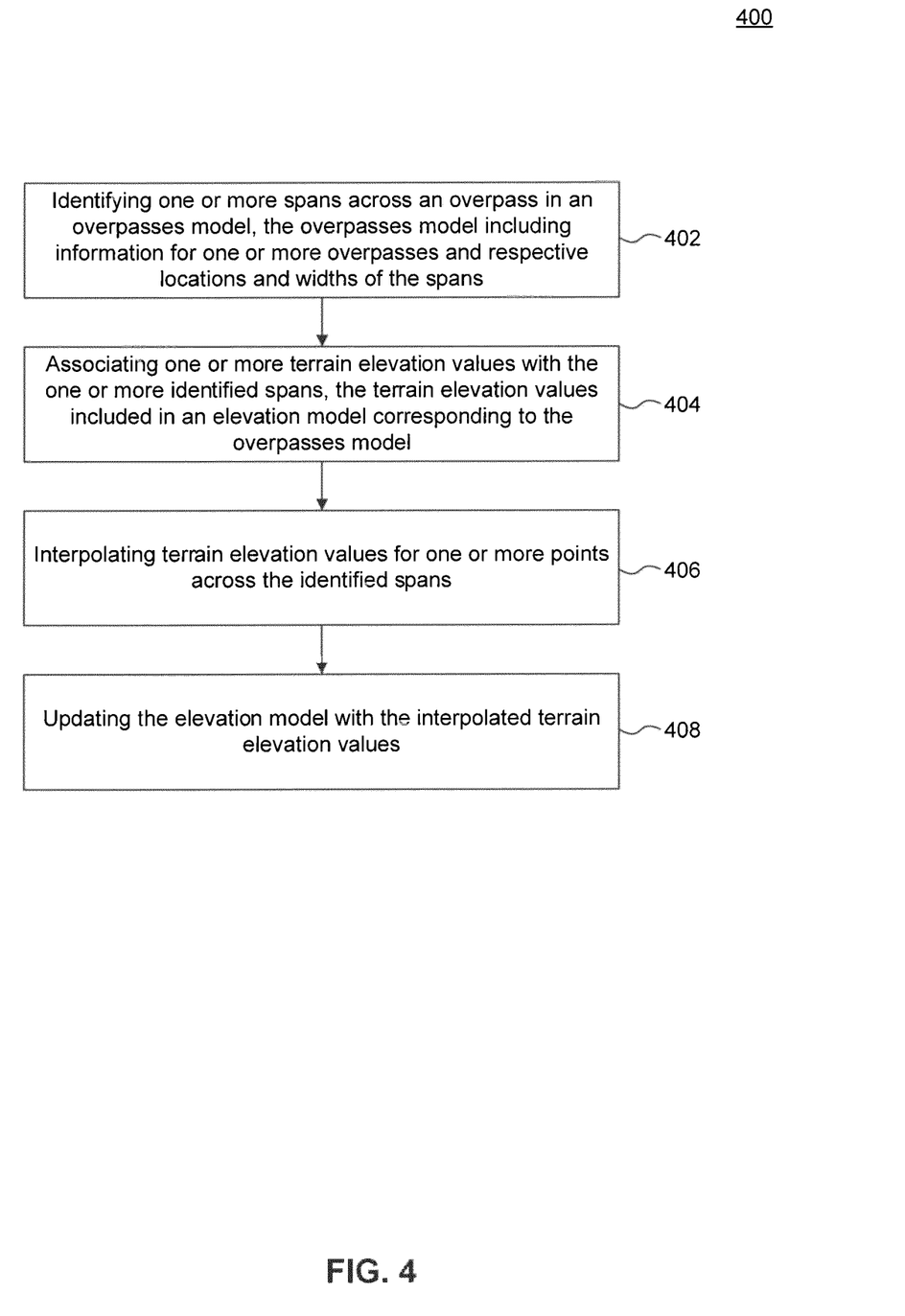
FIG. 4 is a flowchart illustrating an exemplary overall operation, according to an embodiment.

FIG. 4 shows an exemplary overall operation 400. Method 400 begins by identifying one or more spans across an overpass in an overpasses model (step 402). The overpasses model includes information for one or more overpasses (carrying a road and passing over another road) and respective locations and widths of the spans. In an embodiment, step 402 can be performed by span identifier 106. In an embodiment, spans are identified when each endpoint lies in a cell having a valid terrain elevation value.

Method 400 proceeds by associating one or more terrain elevation values with each identified span (step 404). In an embodiment, step 404 can be performed by span identifier 106. For example, shown in FIG. 3, the elevation value E(t−) of cell 308 is associated with the endpoint t− of span 306 and the elevation value E(t+) of cell 310 is associated with endpoint t+ of span 306. The terrain elevation values are included in an elevation model corresponding to the overpasses model.

Method 400 proceeds by interpolating elevation values for one or more points across the identified spans using the associated elevation values (step 406). In an embodiment, step 406 can be performed by elevation interpolator 108. In an embodiment, one-dimensional linear interpolation, shown in FIG. 3, is used to estimate terrain elevations in the span cells between the endpoints. The elevation value E(t−) of cell 308 is associated with the endpoint t− of span 306. The elevation value E(t+) of cell 310 is associated with endpoint t+ of span 306. In an embodiment, equation (1) is used by the elevation interpolator 108 to calculate interpolated elevation values 110 for each cell between endpoints t− and t+ of span 306 using the elevation values associated with t− and t+.

In an embodiment, method 400 uses the interpolated elevation values 110 to update the elevation model (step 408). As an example, elevation interpolator 108 updates the corresponding cells of elevation model 102 with the interpolated elevation values 110.

A conventionally used approach for estimating occluded terrain elevations is to fit the terrain with a Laplacian surface based on valid terrain elevation values in the neighborhood of the occluded terrain elevations. The Laplacian surface provides a smooth fit to the terrain. In other words, the surface simply follows gradations of nearby terrain.

Figure 5:
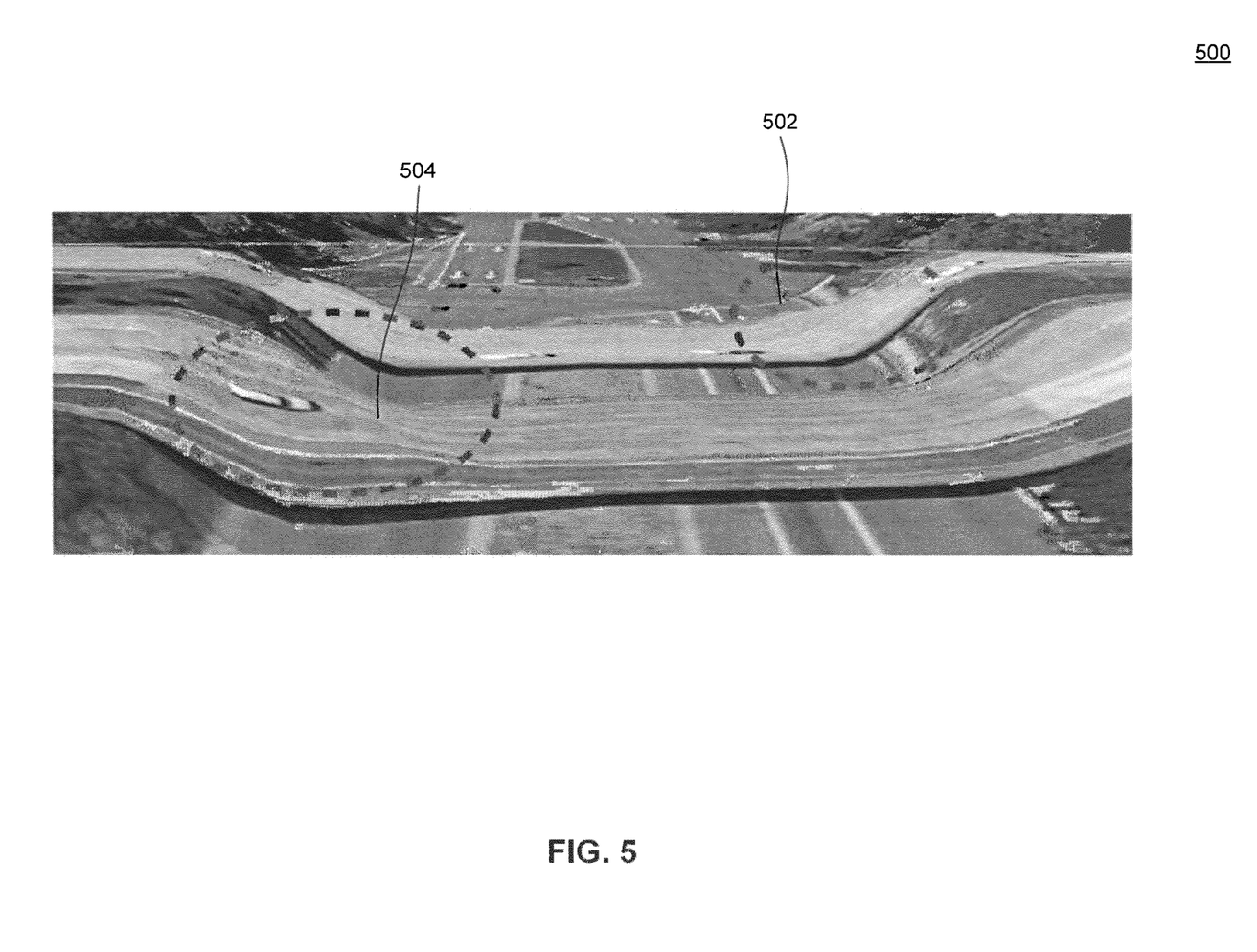
FIG. 5 illustrates inaccuracies when using a conventional approach to synthesize elevation values.

FIG. 5 shows the results when a Laplacian surface is used to estimate elevation in occluded cells under two overpasses. The results are consistent with the elevation of the underlying road in many places, but there are rendering artifacts in two areas 502 and 504 both of which are near an overpass berm. Specifically, the overpass structure has merged with the underlying road. The artifacts occur because a smooth surface does not provide a good fit when there are sharp terrain features (rapid elevation changes) such as can occur when an overpass berm meets the underlying road. The artifacts degrade a user's viewing experience. In other applications (e.g., erosion control, flood plain analysis) the inaccuracies in estimated elevations can cause erroneous results. Conventional methods manually edit the rendered image or the elevation values to provide the needed rendering quality and accuracy. The manual editing increases the cost of producing DTMs.

Figure 6:
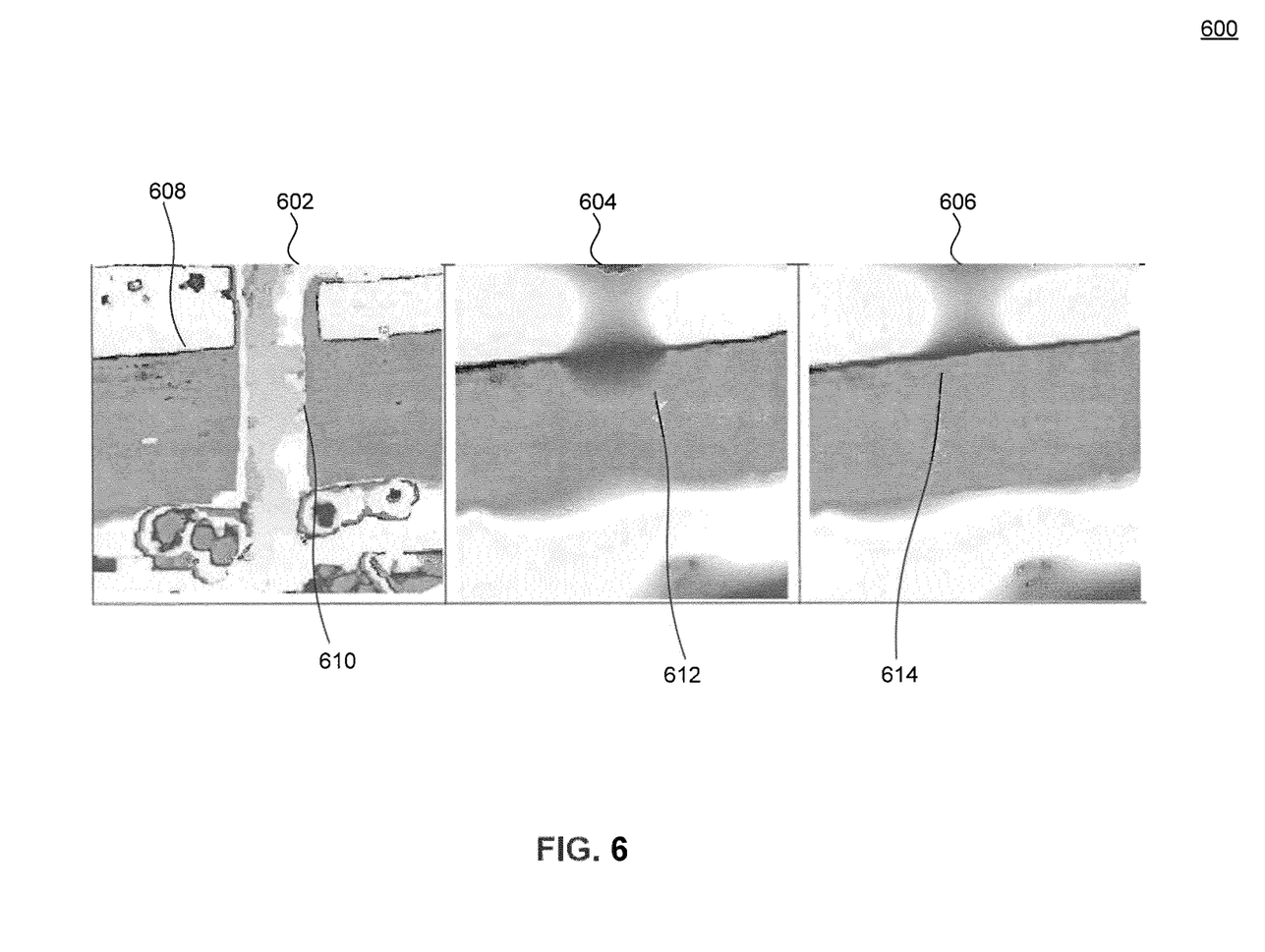
FIG. 6 is an example of the improved accuracies achieved according to an embodiment.

FIG. 6 shows an exemplary result using interpolation according to an embodiment and compares the result to that obtained with a conventional Laplacian surface. A Digital Surface Model (DSM) 602 shows elevations of the bare Earth and of features on or above the earth such as vegetation, buildings, bridges and overpasses. For example, in FIG. 6, a feature is shown by the overpass 610 and the bare Earth is shown by the underlying road 608. The cells of the road 608 under the overpass 610 are occluded by the overpass.

Laplacian surface 604 shows the results of using a conventional Laplacian surface to estimate terrain elevation values for the occluded cells under the overpass. The area under the overpass where the road meets the overpass berm 612 shows a rendering artifact (dark elliptical region) and the elevation is not estimated accurately in those cells. In conventional approaches, manual editing of the elevation values is needed to provide good viewing results. Such manual editing increases cost of producing DTMs.

Span interpolated result 606 illustrates results using an embodiment with linear interpolation. The elevations under the overpass where the road meets the overpass berm 614 are estimated accurately and the rendering artifact of 604 is eliminated. Elevations under the overpass are determined by interpolating along a span between known terrain elevations on either side of the overpass.

Since spans may tend to be parallel to a road under an overpass, interpolation along a span will produce accurate elevation values, particularly when roll (road banking) and elevation variation along the road are limited. The interpolated elevation values determined by the embodiments reduce (or even eliminate) the need for manual editing of elevation values.

In this way roads, for example, are appropriately elevated even in places where there are elevation changes (e.g., rapid changes) perpendicular (or adjacent) to the road. These elevation changes may occur where overpass berms (i.e., artificial ridges or embankments) meet underlying roads.

While embodiments are described in terms of overpasses and roads, the embodiments are not limited to such data and the techniques described herein and can be applied to any form of data, including but not limited to overpasses passing over a train track, path, canal, river or other pathway. The teachings herein will enable others skilled in the art to readily modify and/or adapt for various applications such specific embodiments without undo experimentation, without departing from the general concept of the invention.

Figure 7:
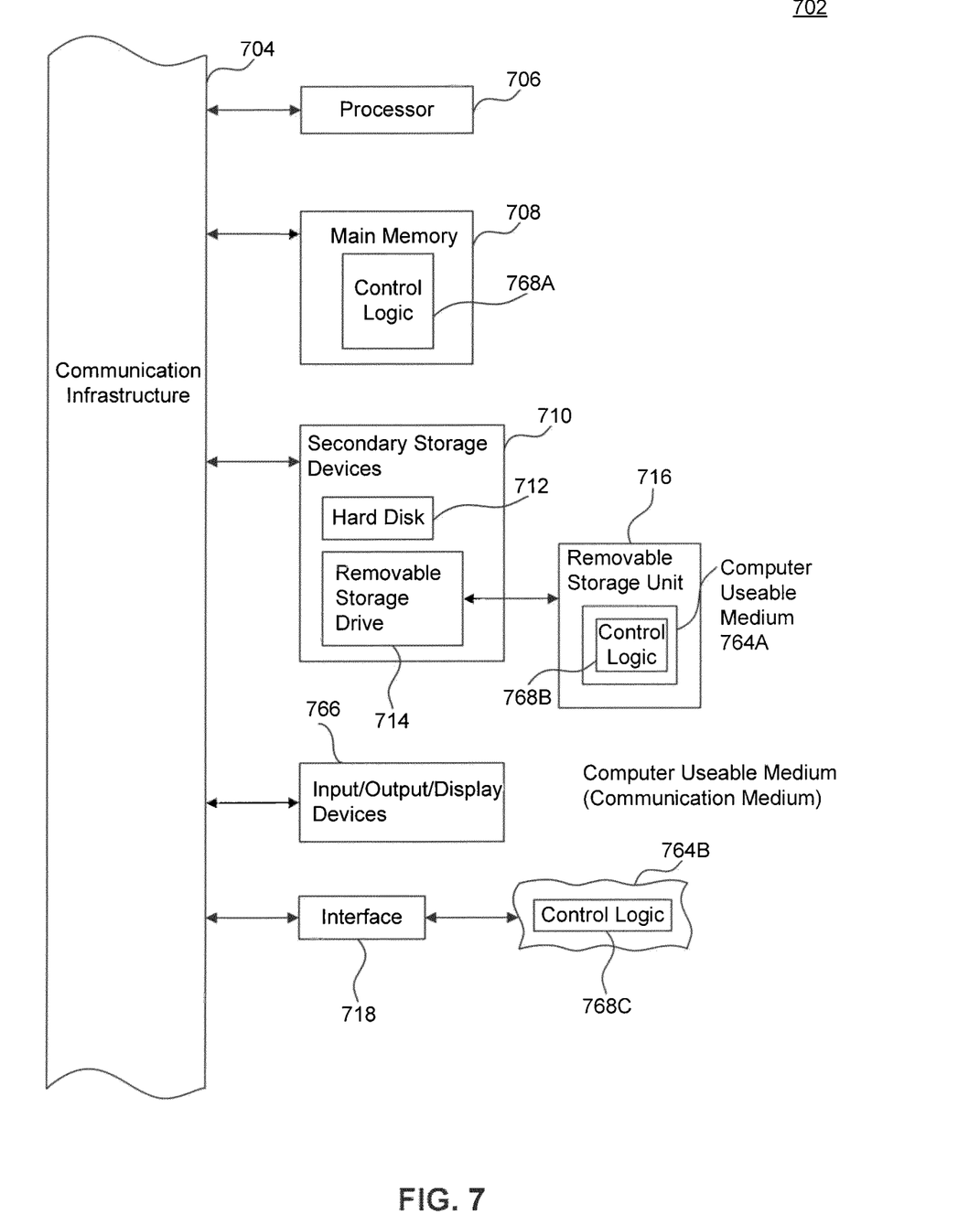
FIG. 7 illustrates an example computer useful for implementing components of the embodiments.

In an embodiment, the system, methods and components of embodiments described herein are implemented using one or more computers, such as example computer 702 shown in FIG. 7. For example, span identifier 106 and elevation interpolator 108 can be implemented using computer(s) 702.

Computer 702 can be any commercially available and well known computer capable of performing the functions described herein, such as computers available from International Business Machines, Apple, Oracle, HP, Dell, Cray, etc.

Computer 702 includes one or more processors (also called central processing units, or CPUs), such as a processor 706. Processor 706 is connected to a communication infrastructure 704.

Computer 702 also includes a main or primary memory 708, such as random access memory (RAM). Primary memory 708 has stored therein control logic 768A (computer software), and data.

Computer 702 also includes one or more secondary storage devices 710. Secondary storage devices 710 include, for example, a hard disk drive 712 and/or a removable storage device or drive 714, as well as other types of storage devices, such as memory cards and memory sticks. Removable storage drive 714 represents a floppy disk drive, a magnetic tape drive, a compact disk drive, an optical storage device, tape backup, etc.

Removable storage drive 714 interacts with a removable storage unit 716. Removable storage unit 716 includes a computer useable or readable storage medium 764A having stored therein computer software 768B (control logic) and/or data. Removable storage unit 716 represents a floppy disk, magnetic tape, compact disk, DVD, optical storage disk, or any other computer data storage device. Removable storage drive 714 reads from and/or writes to removable storage unit 716 in a well-known manner.

Computer 702 also includes input/output/display devices 766, such as monitors, keyboards, pointing devices, Bluetooth devices, etc.

Computer 702 further includes a communication or network interface 718. Network interface 718 enables computer 702 to communicate with remote devices. For example, network interface 718 allows computer 702 to communicate over communication networks or mediums 764B (representing a form of a computer useable or readable medium), such as LANs, WANs, the Internet, etc. Network interface 718 may interface with remote sites or networks via wired or wireless connections.

Control logic 768C may be transmitted to and from computer 702 via communication medium 764B.

Any tangible apparatus or article of manufacture comprising a computer useable or readable medium having control logic (software) stored therein is referred to herein as a computer program product or program storage device. This includes, but is not limited to, computer 702, main memory 708, secondary storage devices 710 and removable storage unit 716. Such computer program products, having control logic stored therein that, when executed by one or more data processing devices, cause such data processing devices to operate as described herein, represent the embodiments.

Embodiments can work with software, hardware, and/or operating system implementations other than those described herein. Any software, hardware, and operating system implementations suitable for performing the functions described herein can be used. Embodiments are applicable to both a client and to a server or a combination of both.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A computer-implemented method, comprising:
    identifying, by one or more computing devices, a first overpass in an overpasses model, the overpasses model describing respective locations and widths of one or more overpasses, wherein each of the one or more overpasses occludes a portion of terrain located below such overpass;
    identifying, by the one or more computing devices, at least a first span across the first overpass, the first span corresponding to a line across the width of the first overpass;
    identifying, by the one or more computing devices, a pair of endpoints of the first span;
    determining, by the one or more computing devices, a pair of terrain elevation values respectively for the pair of endpoints of the first span, the pair of terrain elevation values included in an elevation model;
    interpolating, by the one or more computing devices, the pair of terrain elevation values for one or more points across the first span to obtain an interpolated terrain elevation value for each of the one or more points across the first span; and
    updating, by the one or more computing devices, the elevation model to associate the interpolated terrain elevation values with the portion of terrain occluded by the first overpass.

2. The method of claim 1,
    wherein the one or more points across the first span correspond to invalid terrain elevation values in the elevation model.

3. The method of claim 1, further comprising, prior to determining the pair of terrain elevation values:
    aligning, by the one or more computing devices, the elevation model with the overpasses model.

4. The method of claim 1, wherein identifying, by the one or more computing devices, the pair of terrain elevation values respectively for the pair of endpoints comprises identifying, by the one or more computing devices, a pair of elevation model cells that respectively have valid terrain elevation values and include the respective locations of the pair of endpoints.

5. The method of claim 4, wherein interpolating, by the one or more computing devices, the pair of terrain elevation values comprises linearly interpolating, by the one or more computing devices, the pair of terrain elevation values for the one or more points across the first span to obtain a linearly interpolated terrain elevation value for each of the one or more points across the first span.

6. The computer-implemented method of claim 1, wherein identifying, by the one or more computing devices, at least the first span across the first overpass comprises identifying, by the one or more computing devices, at least the first span corresponding to the line across the width of the first overpass, the line substantially perpendicular to a path on a surface of the first overpass.

7. The computer-implemented method of claim 6, wherein identifying, by the one or more computing devices, at least the first span across the first overpass further comprises identifying, by the one or more computing devices, a set of cells that include the line across the width of the first overpass.

8. The computer-implemented method of claim 7, wherein determining, by the one or more computing devices, the pair of terrain elevation values respectively for the pair of endpoints comprises:
    identifying, by the one or more computing devices, a first pair of cells of the set of cells which respectively include the respective locations of the pair of endpoints; and
    selecting, by the one or more computing devices, the pair of terrain elevation values respectively associated with the identified first pair of cells as the respective terrain elevation values for the pair of endpoints.

9. The computer-implemented method of claim 1, wherein identifying, by the one or more computing devices, at least the first span across the first overpass comprises:
    identifying, by the one or more computing devices, a first point on a road vector associated with the first overpass; and
    constructing, by the one or more computing devices, the first span from the first point and perpendicular to the road vector.

10. The computer-implemented method of claim 1, wherein identifying, by the one or more computing devices, the pair of endpoints of the first span comprises comparing, by the one or more computing devices, sequential terrain elevation values associated with the first span until a pair of decreases that are respectively greater than a threshold value are identified.

11. The computer-implemented method of claim 10, wherein determining, by the one or more computing devices, the pair of terrain elevation values respectively for the pair of endpoints comprises respectively selecting, by the one or more computing devices, a lesser terrain elevation value from each of two pairs of sequential terrain elevation values respectively associated with the pair of decreases.

12. A computer-based system, comprising:
one or more processors;
a span identifier configured to:
identify at least a first span across a first overpass in an overpasses model that describes respective locations and widths of one or more overpasses that respectively obscure one or more portions of terrain, the first span corresponding to a line across the width of the first overpass;
identify a pair of endpoints of the first span; and
determine a pair of terrain elevation values respectively for the pair of endpoints of the first span, the pair of terrain elevation values included in an elevation model corresponding to the overpasses model; and
an elevation interpolator configured to:
interpolate the pair of terrain elevation values for one or more points across the first span to obtain an interpolated terrain elevation value for each of the one or more points across the first span; and
update the elevation model to associate the interpolated terrain elevation values with the portion of terrain occluded by the first overpass,
wherein the span identifier and the elevation interpolator are implemented by the one or more processors.

13. The system of claim 12, further comprising an alignment module configured to align the elevation model with the overpasses model.

14. The system of claim 12, wherein the span identifier is further configured to identify a pair of elevation model cells that respectively have valid terrain elevation values and include the respective locations of the pair of endpoints.

15. The system of claim 14, wherein the elevation interpolator is configured to interpolate the terrain elevation values along the first span using linear interpolation.

16. A non-transitory computer storage apparatus encoded with a computer program, the program comprising instructions that when executed by data processing apparatus cause the data processing apparatus to perform operations, the operations comprising:

identifying a first overpass in an overpasses model, the overpasses model describing respective locations and widths of one or more overpasses, wherein each of the one or more overpasses occludes a portion of terrain located below such overpass;
identifying at least a first span across the first overpass, the first span corresponding to a line across the width of the first overpass;
identifying a pair of endpoints of the first span;
determining a pair of terrain elevation values respectively for the pair of endpoints of the first span, the pair of terrain elevation values included in an elevation model;
interpolating the pair of terrain elevation values for one or more points across the first span to obtain an interpolated terrain elevation value for each of the one or more points across the first span; and
updating the elevation model to associate the interpolated terrain elevation values with the portion of terrain occluded by the first overpass.

17. The computer storage apparatus of claim 16, the operations wherein the one or more points across the first span correspond to invalid terrain elevation values in the elevation model.

18. The computer storage apparatus of claim 16, the operations further comprising:
aligning the elevation model with the overpasses model prior to determining the pair of terrain elevation values.

19. The computer storage apparatus of claim 16, the operations wherein identifying the pair of terrain elevation values respectively for the pair of endpoints comprises identifying a pair of elevation model cells that respectively have valid terrain elevation values and include the respective locations of the pair of endpoints.

20. The computer storage apparatus of claim 19, the operations wherein interpolating the pair of terrain elevation values comprises linearly interpolating the pair of terrain elevation values for the one or more points across the first span to obtain a linearly interpolated terrain elevation value for each of the one or more points across the first span.

* * * * *